(12) United States Patent
Spencer et al.

(10) Patent No.: US 7,754,587 B2
(45) Date of Patent: Jul. 13, 2010

(54) SILICON DEPOSITION OVER DUAL SURFACE ORIENTATION SUBSTRATES TO PROMOTE UNIFORM POLISHING

(75) Inventors: Gregory S. Spencer, Pflugerville, TX (US); Peter J. Beckage, Austin, TX (US); Mariam G. Sadaka, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 546 days.

(21) Appl. No.: 11/375,796

(22) Filed: Mar. 14, 2006

(65) Prior Publication Data

US 2007/0218654 A1     Sep. 20, 2007

(51) Int. Cl.
*H01L 21/20* (2006.01)
*H01L 21/36* (2006.01)

(52) U.S. Cl. .............. 438/489; 438/481; 257/E21.131
(58) Field of Classification Search ................ 438/199, 438/150, 154, 157, 481, 489; 257/351
See application file for complete search history.

(56) References Cited

U.S. PATENT DOCUMENTS

| | | | |
|---|---|---|---|
| 6,214,653 B1 | 4/2001 | Chen et al. | 438/153 |
| 6,245,161 B1 | 6/2001 | Henley et al. | 148/33.4 |
| 6,558,802 B1 | 5/2003 | Henley et al. | 428/446 |
| 6,649,494 B2 | 11/2003 | Tamura et al. | 438/481 |
| 6,815,278 B1 | 11/2004 | Ieong et al. | 438/198 |
| 6,825,534 B2 | 11/2004 | Chen et al. | 257/354 |
| 2002/0175370 A1 | 11/2002 | Bockelman | 257/344 |
| 2003/0017622 A1 | 1/2003 | Mastroianni | 438/3 |
| 2003/0211713 A1* | 11/2003 | Suguro et al. | 438/481 |
| 2006/0049460 A1* | 3/2006 | Chen et al. | 257/347 |

OTHER PUBLICATIONS

PCT/US2007/062096International Search Report and Written Opinion.

* cited by examiner

*Primary Examiner*—Matthew C Landau
*Assistant Examiner*—Sonya D McCall-Shepard
(74) *Attorney, Agent, or Firm*—Hamilton & Terrile, LLP; Michael Rocco Cannatti

(57) ABSTRACT

A semiconductor process and apparatus provide a planarized hybrid substrate (16) by selectively depositing an epitaxial silicon layer (70) to fill a trench (96), and then blanket depositing silicon to cover the entire wafer with near uniform thickness of crystalline silicon (102) over the epi silicon layer (70) and polycrystalline silicon (101, 103) over the nitride mask layer (95). The polysilicon material (101, 103) added by the two-step process increases the polish rate of subsequent CMP polishing to provide a more uniform polish surface (100) over the entire wafer surface, regardless of variations in structure widths and device densities. By forming first gate electrodes (151) over a first SOI layer (90) using deposited (100) silicon and forming second gate electrodes (161) over an epitaxially grown (110) silicon layer (70), a high performance CMOS device is obtained which includes high-k metal PMOS gate electrodes (161) having improved hole mobility.

20 Claims, 4 Drawing Sheets

SILICON DEPOSITION OVER DUAL SURFACE ORIENTATION SUBSTRATES TO PROMOTE UNIFORM POLISHING

BACKGROUND OF THE INVENTION

1. Field of the Invention

The present invention is directed in general to the field of semiconductor devices. In one aspect, the present invention relates to high-performance complementary metal oxide semiconductor (CMOS) field effect transistors (FETs) fabricated on hybrid or dual substrates.

2. Description of the Related Art

To address the difference in electron and hole mobility values for NMOS and PMOS transistor devices formed on semiconductor wafers having a single crystal orientation, CMOS devices are increasingly fabricated with hybrid substrates with different surface orientations using semiconductor-on-insulator (SOI) wafer bonding to provide PMOS and NMOS devices with their own optimized crystal orientation. Prior attempts to integrate dual or hybrid substrates have used epitaxial growth to form one of the crystal surface orientations, but have resulted in non-uniform silicon step/recess heights between the different crystal surfaces after the grown epitaxial material is polished with a chemical mechanical polish (CMP) step. An example is depicted in FIGS. 1-3 which show a device 10 having two crystal surface orientations—surface 1 having a first orientation and an SOI layer 3 having a second orientation—separated by buried oxide layers 2 and isolation regions 4 and covered by nitride layers 6. As shown in FIG. 1, an epi silicon layer 7 (having the first orientation) is formed in an opening in the device 10. After the epi silicon 8 is polished (as depicted in FIG. 2), the surface of the epi silicon 8 is recessed below the nitride layer 6. However, when the nitride layer 6 is stripped (as depicted in FIG. 3), the epi silicon 8 is higher than the underlying SOI layer 3. The non-uniform surface heights impair photolithography control and increase dispersion of device parametrics and performance, especially when the sizes and density of the device structures vary.

Accordingly, a need exists for a semiconductor manufacturing process which improves the post-CMP planarity of the dual surface orientation devices. There is also a need for a fabrication process which avoids the process and performance limitations associated with non-uniform surface heights. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
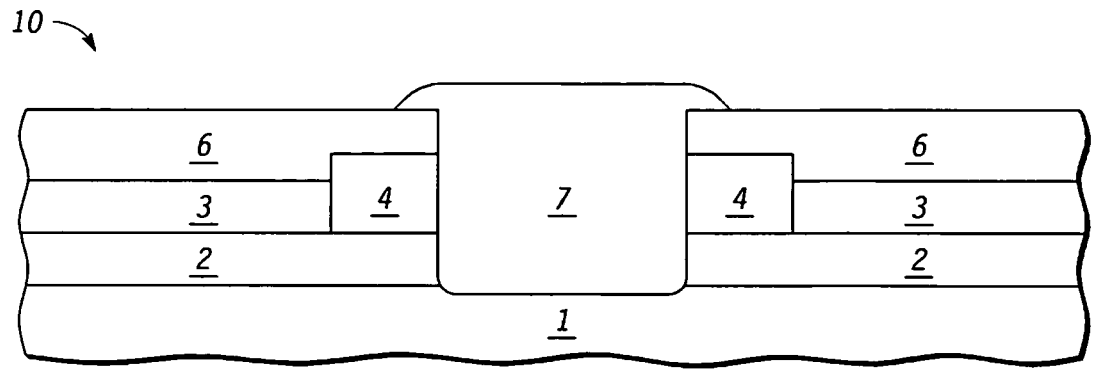
FIG. 1 is a partial cross-sectional view of a conventionally formed dual surface orientation wafer structure after formation of a selective epitaxial silicon layer.
Figure 2:
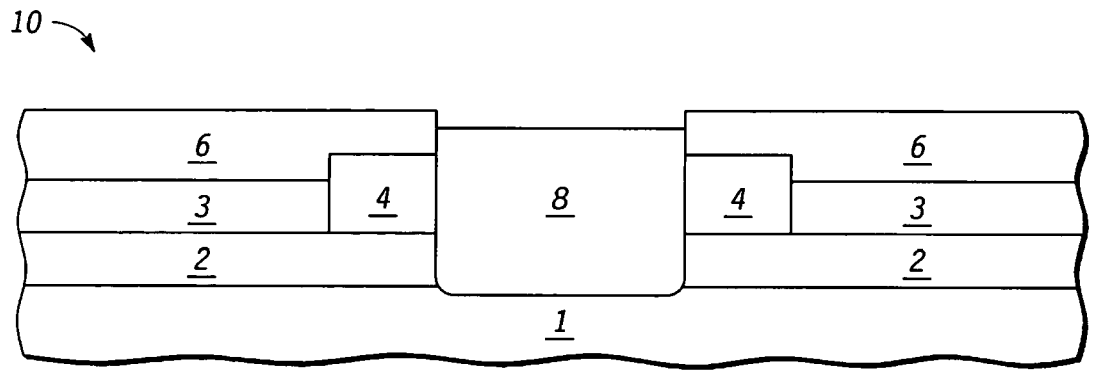
FIG. 2 illustrates processing subsequent to FIG. 1 after polishing of the epi silicon layer.
Figure 3:
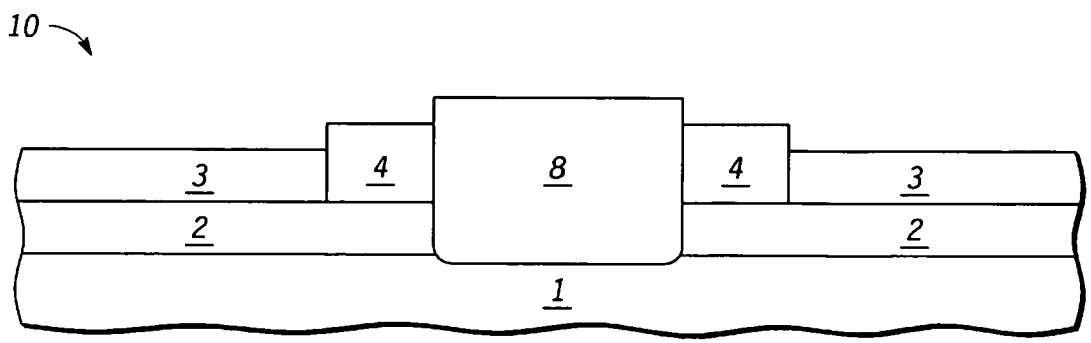
FIG. 3 illustrates processing subsequent to FIG. 2 after a nitride layer is stripped, leaving two surfaces having non-uniform heights.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high performance CMOS devices with hybrid or dual surface orientations having substantially uniform surface heights by selectively growing epitaxial silicon to partially or completely fill a trench opening and then non-selectively forming silicon layers using a blanket silicon deposition step to cover the entire wafer with a nearly uniform thickness of silicon and polysilicon over the dual surface areas. With a substantially planar blanket of silicon and polysilicon formed, subsequent chemical mechanical polishing has reduced post-polish variation between large and small features in isolated and dense areas, due in part to the increase the polish rate that is caused by the additional polysilicon which creates more friction and elevated polishing temperatures during polishing. By improving the post-CMP planarization of the dual surfaces, better photolithography control is obtained and dispersion in device parametrics and performance is reduced. In addition, improved planarity in the pre-CMP substrate heights reduces non-uniformity due to variations is structure widths and device densities. Thus, integration of Dual-Surface Orientation (DSO) substrates is promoted by epitaxially depositing a silicon substrate layer using a combination of selective and non-selective (i.e., blanket) deposition processes.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 4:
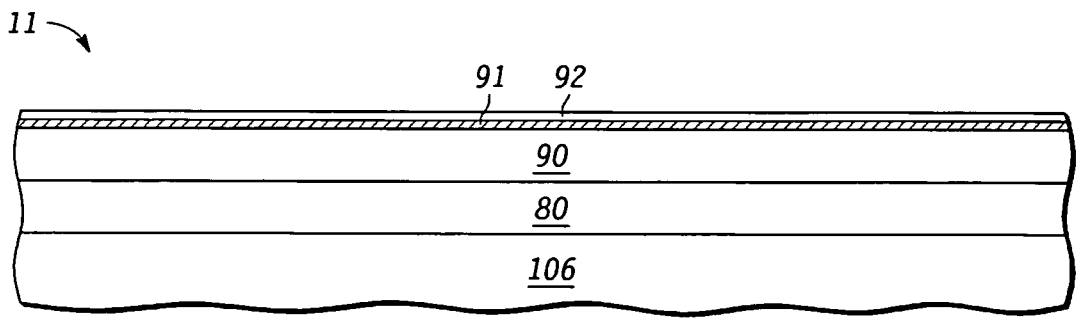
FIG. 4 is a partial cross-sectional view of a semiconductor wafer structure on which first oxide and nitride layers are deposited over SOI layers and a semiconductor substrate.

Turning now to FIG. 4, a partial cross-sectional view is illustrated of a semiconductor wafer structure 11 on which first oxide layer 91 and nitride layer 92 are deposited over semiconductor-on-insulator (SOI) layers 80, 90 and a semiconductor substrate layer 106. Specifically, the structure 11 includes a first semiconductor layer 106 formed of a semiconductor material that has a first crystallographic orientation. Depending on the type of transistor device being fabricated, the first semiconductor layer 106 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. As will be appreciated, the semiconductor layer 106 may be appropriately doped to provide n-type (electron) and p-type (hole) carriers. The crystallographic orientation of the first semiconductor layer 106 may be (110), (111), or (100).

In the SOI layers, the structure 11 includes an insulator layer 80 formed on the first semiconductor layer 106 which will ultimately be used to form the buried oxide (BOX) layer for semiconductor-on-insulator devices. In addition, the SOI layers include a second semiconductor layer 90 formed of a semiconductor material which has a second crystallographic orientation which is different from the first crystallographic orientation. Depending on the type of transistor device being fabricated, the second semiconductor layer 90 may be formed from any semiconductor material, including, for example, Si, SiC, SiGe, SiGeC, Ge, GaAs, InAs, InP as well as other III/V or II/VI compound semiconductors or any combination thereof. It will also be appreciated that the second semiconductor layer 90 may be appropriately doped to provide n-type (electron) and p-type (hole) carriers. The crystallographic orientation of the second semiconductor layer 90 may be (100), (111), or (110), so long as the crystallographic orientation of the second semiconductor layer 90 differs from the crystallographic orientation of the first semiconductor layer 106. The crystal orientations of the first semiconductor layer 106 and the second semiconductor layer 90 will depend on the materials used to form the wafer structure 11. For example, when Si is employed as the semiconductor material, electron mobility is higher on a (100) surface orientation, and hole mobility is higher on a (110) surface orientation, provided that the channel direction is oriented in the <110> direction. In this case, the (100) Si surface is used as the substrate layer for NMOS devices, while the (110) Si surface is used as the substrate layer for PMOS devices. As depicted in FIG. 4, an oxide layer 91 is formed on the second semiconductor layer 90, followed by deposition of a nitride layer 92.

Figure 5:
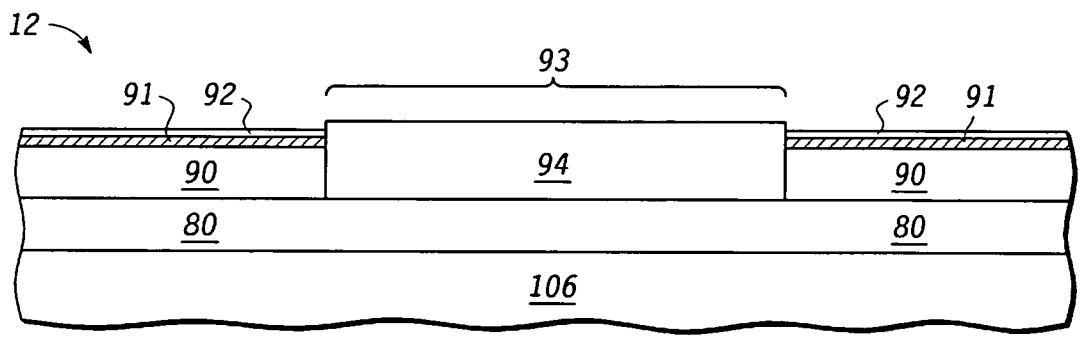
FIG. 5 illustrates processing subsequent to FIG. 4 where portions of the first oxide layer, the first nitride layer and an SOI semiconductor layer have been removed and replaced with a deposited oxide layer.

FIG. 5 illustrates processing of a semiconductor wafer structure 12 subsequent to FIG. 4 where portions of the first oxide layer 91, the first nitride layer 92 and the second semiconductor layer 90 have been removed and replaced with a deposited and polished oxide layer 94. In particular, after forming the first oxide layer 91 and nitride layer 92, a mask layer (not shown) may optionally be formed on an exposed upper surface of the nitride layer 92. Using the oxide layer 91 and nitride layer 92 (and optional mask layer), conventional patterning and anisotropic etching techniques may be used to form an opening 93 through the second semiconductor layer 90. In this opening 93, an oxide layer 94 is formed to replace the second semiconductor layer 90 in the opening 93 by depositing an overlying layer of oxide and then polishing the oxide back substantially to level with the mask layer 92 (as shown in FIG. 5) or back to the level of the second semiconductor layer 90 (not shown).

Figure 6:
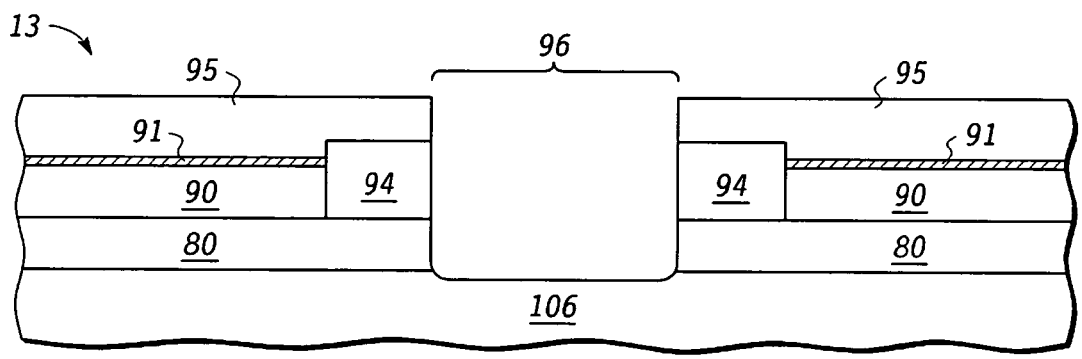
FIG. 6 illustrates processing subsequent to FIG. 5 after the first nitride layer is removed and a second nitride layer is formed over the wafer structure, and portions of the second nitride layer, deposited oxide layer and a buried oxide layer have been etched or removed to form an opening.

FIG. 6 illustrates processing of a semiconductor wafer structure 13 subsequent to FIG. 5 after the first nitride layer 92 is removed and a mask layer (e.g., a second nitride layer) 95 is formed over the wafer structure, and then portions of the second nitride layer 95, deposited oxide layer 94, and a buried oxide layer 80 have been etched or removed by patterning and etching to remove an exposed portion of the oxide layer 94 and insulator layer 80, thereby forming a second etch opening 96 to the exposed first semiconductor layer 106. The pattern transfer and etching of the mask layer may use one or more etching steps to selectively remove the unprotected portions of the oxide layers 94, 80, including a dry etching process such as reactive-ion etching, ion beam etching, plasma etching or laser etching, a wet etching process wherein a chemical etchant is employed or any combination thereof.

The opening 96 is used to define and differentiate active regions for first and second types of MOS devices subsequently formed on the wafer structure 13. For example, the unetched portions of the second semiconductor layer 90 define a first device region for a first type of MOS device, while the portions of the first semiconductor layer 106 that is exposed by the opening 96 (and that is subsequently epitaxially regrown, as described hereinbelow) defines a second device region for a second type of MOS device. To this end, the unetched portions of the oxide layer 94 may be used to form at least part of the shallow trench isolation regions for electrically and physically isolating the first and second device regions from one another by designing the width and placement of the second etch opening 96 to be smaller than the width of the first etch opening 93, and contained within the first etch opening 93.

Figure 7:
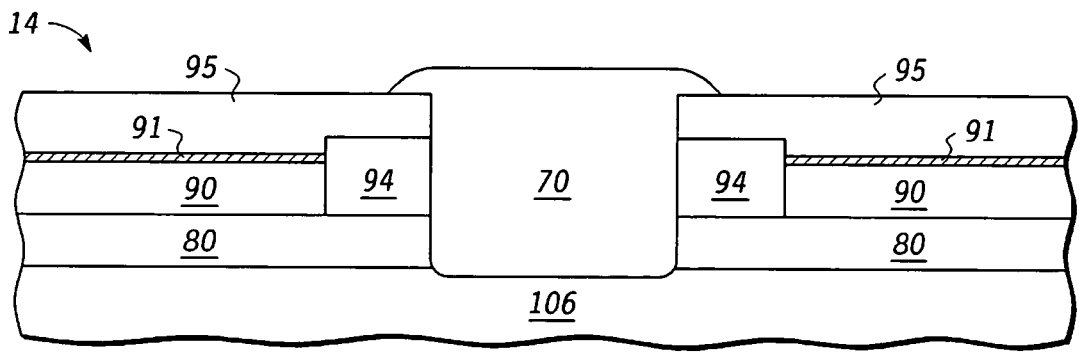
FIG. 7 illustrates processing subsequent to FIG. 6 after an epitaxial silicon layer is selectively formed to partially or completely fill the opening.

Turning now to FIG. 7, processing of a semiconductor wafer structure 14 subsequent to FIG. 6 is illustrated to show formation of a selective epitaxial silicon layer 70 to partially or completely fill the opening 96 so that it is higher than the second semiconductor layer 90 and/or the mask layer 95. As described herein and understood by those skilled in the art, the process of forming an epitaxial layer may be described as either depositing or growing a layer so that the "growth" and "deposition" terms are used interchangeably in this respect. By selectively forming the semiconductor layer 70 so that its crystallographic orientation is different from the crystallographic orientation of the second semiconductor layer 90, the mobility of the holes and electrons for subsequently formed PMOS and NMOS devices, respectively, may be optimized. Since the regrown semiconductor layer 70 is epitaxially grown from the first semiconductor layer 106, they will have the same crystallographic orientations, though the layers 70, 106 can be formed of different semiconductor materials. Depending on the type of transistor device being fabricated, the semiconductor layer 70 may be formed from any (doped or undoped) semiconductor material, such as Si, SiGe, SiC, SiGeC or combinations thereof, which is capable of being formed utilizing a selective epitaxial growth method. Selected embodiments of the present invention also contemplate using strained or compressed materials to further enhance mobility. For example, if PMOS devices are formed over the semiconductor layer 70, the semiconductor layer 70 may be formed by epitaxially growing silicon having a crystallographic orientation (e.g., (110)) that is the same as the crystallographic orientation of the first semiconductor layer 106. This epitaxial growth may be achieved by heating the semiconductor wafer structure 13 to a temperature between 500 and 900° C. in the presence of dichlorosilane, HCL and hydrogen gas. Alternatively, if NMOS devices are formed over the semiconductor layer 70, at least a portion of the epitaxially grown layer 70 may be formed by epitaxially growing silicon having a (100) crystallographic orientation. In this case, the second semiconductor layer would have a (110) crystallographic orientation, and the PMOS device would be built on this layer. By optimizing the crystallographic orientations of the layers 70, 106 (e.g., so that the epitaxially grown layer 70, or "epi-layer," is formed of (110) semiconductor material and the second semiconductor layer 90 is formed of (100) semiconductor material), significant mobility improvements are obtained over single-orientation substrates—up to 2.5× improvement for hole mobility in PMOS devices formed over silicon dioxide gate layers. In addition, by completely filling the trench opening 96 with an epitaxial semiconductor layer 70 that grows above and over the nitride mask layer 95, crystalline defectivity in the trench opening 96 is reduced or minimized. It will be appreciated that, when the epi layer 70 is formed with n-type material, the second semiconductor layer 90 in the SOI region may be formed of depositing strained p-type semiconductor material having a second crystal orientation that is different from the first crystal orientation.

Figure 8:
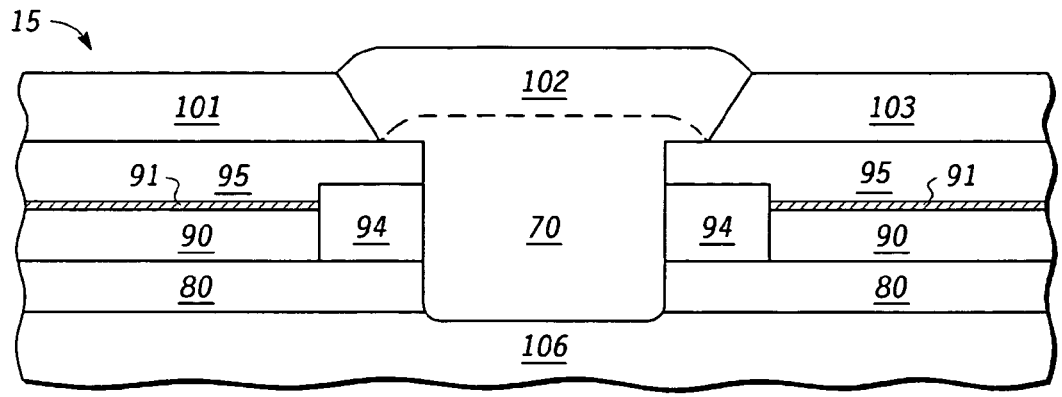
FIG. 8 illustrates processing subsequent to FIG. 7 after blanket silicon deposition forms layers of silicon and polysilicon at substantially uniform heights.

FIG. 8 illustrates processing of a semiconductor wafer structure 15 subsequent to FIG. 7 after a blanket silicon deposition step forms layers of polysilicon 101, 103 and silicon 102 at substantially uniform heights over the nitride mask layer 95 and epitaxial silicon layers 70. This non-selective formation of silicon layers 101, 102, 103 may be achieved by heating the semiconductor wafer structure 15 to a temperature between 500 and 900° C. in the presence of dichlorosilane, silane or other silicon precursor, and hydrogen gas. In a selected embodiment, the polysilicon layers 101, 103 are between 100-5000 Angstroms thick, while the silicon layer 102 is between 100-5000 Angstroms thick. By non-selectively depositing a blanket layer of silicon, polysilicon layers 101, 103 are formed over the exposed nitride mask layers 95, while crystalline silicon 102 with orientation equivalent to the epi layer 70 is grown over the epi layer 70. As a result, the entire wafer is covered with a nearly uniform thickness of silicon and polysilicon over the dual substrate areas.

Figure 9:
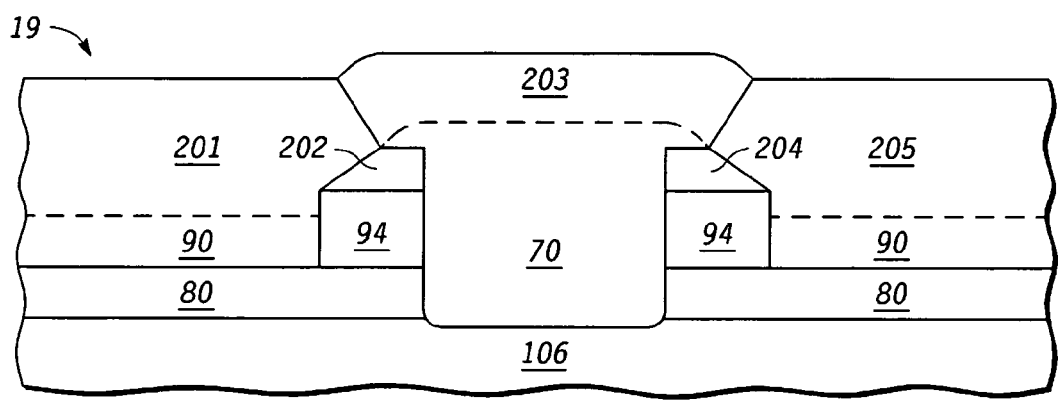
FIG. 9 illustrates processing subsequent to FIG. 7 after the nitride mask and pad oxide layers are stripped and silicon is blanket deposited.

In accordance with various alternative embodiments, processing of a semiconductor wafer structure 19 is illustrated in FIG. 9, wherein the nitride mask layer 95 and pad oxide layer 91 have been stripped prior to the blanket depositing silicon. In this case, a nonselective silicon deposition step forms polysilicon layers 202, 204 over the shallow trench isolation regions 94. In addition, the nonselective silicon deposition step forms crystalline silicon 201, 205 over the SOI semiconductor layer 90, where the crystalline silicon 201, 205 has an orientation that is equivalent to the SOI semiconductor layer 90. The nonselective silicon deposition simultaneously forms crystalline silicon 203 over the epi semiconductor layer 70, where the crystalline silicon 203 has an orientation that is equivalent to the substrate 106. When the SOI semiconductor layer 90 is formed with a (100) crystallographic orientation, it will have a higher deposition rate than an epi semiconductor layer 70 formed with a (110) silicon, thereby increasing the thickness of the SOI semiconductor layer 90 (with the crystalline silicon 201, 205) relative to the epi semiconductor layer 70 (with the crystalline silicon 203). As a result, the entire wafer is covered with a nearly uniform thickness of silicon and polysilicon over the dual surface areas.

Though the sequence illustrated in the figures shows the shallow trench isolation regions 94 being formed prior to the DSO regions 70, it will be appreciated that the blanket silicon deposition step can be used regardless of the sequence of forming the DSO and STI regions. For example, the DSO regions may be formed prior to the shallow trench isolation regions, followed by the blanket silicon deposition step.

Figure 10:
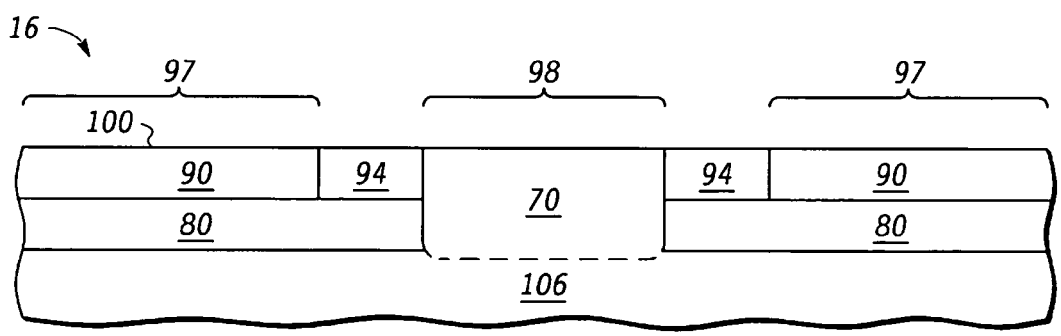
FIG. 10 illustrates processing subsequent to FIG. 8 or 9 after CMP polishing of the wafer structure.

FIG. 10 illustrates processing of a semiconductor wafer structure 16 subsequent to FIG. 8 or 9 after CMP polishing of the wafer structure and removal of the nitride mask layer 95 and first oxide layer 91. In accordance with various embodiments of the present invention, the presence of the additional polysilicon layers 101, 103 (such as shown in FIG. 8) increases the temperature on the pad when subsequent CMP polishing occurs (possibly due to an increase in friction), resulting in a higher polish rate. Thus, despite the fact that there is more epi/poly to polish, the overall polish times will be reduced due to the elevated polishing temperature. In addition, the nearly planar blanket area of epi silicon and polysilicon layers 101-103 reduces post-polish variation between large and small features in isolated and dense areas. Chemical mechanical polishing or any desired etchant process may be used to remove the polysilicon layer 101, 103 and epi silicon layers 70, 102, including dry etching, wet etching or oxidation of silicon. As for the removal of mask and oxide layers 95, 91, any desired stripping process may be used that is capable of selectively removing the patterned mask and oxide layers 95, 91 from the structure 16. As a result, a dual surface orientation structure having a substantially coplanar surface 100 is obtained by polishing and/or etching the semiconductor layer 70 back to the same level as the second semiconductor layer 90 and removing the layers of oxide 91 and nitride 95. Of course, the semiconductor layer 70 may be polished or etched back to a lesser or greater extent, but in any case is substantially coplanar with the second semiconductor layer 90 to facilitate CMOS processing.

As a result of the foregoing steps, shallow trench isolations regions formed from the unetched oxide layer 94 serve to provide electrical and physical isolation between transistor devices in the first semiconductor active device region 97 and transistor devices in the second semiconductor active device region 98. It will be appreciated that isolation regions may also be formed as field oxide regions or isolation dielectric trenches using any desired process. For example, isolation regions comprised of a silicon-oxide (or other dielectric) compound may be formed by defining trench areas with mask and patterning steps, etching trenches in selected portions of the layers 90, 80, 106, filling the trenches with a deposited dielectric, and polishing or etching the wafer to remove the excess dielectric. Alternatively, isolation dielectric trenches may be formed using conventional LOCOS processing in which silicon nitride is deposited and patterned to define the isolation regions and, thereafter, the exposed silicon of wafer structure 16 is thermally oxidized to form the isolation dielectric.

Figure 11:
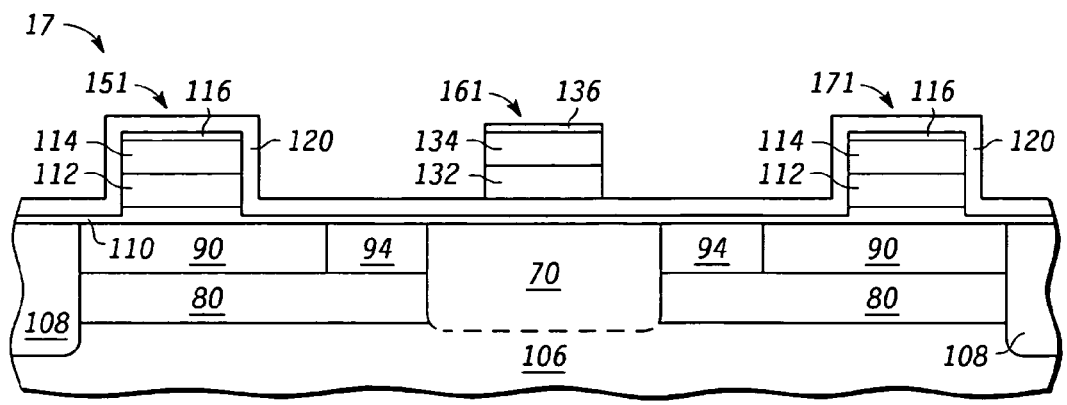
FIG. 11 illustrates processing subsequent to FIG. 10 in which first and second gate electrodes are partially formed with one or more high-k gate dielectric layers.

FIG. 11 illustrates processing of a semiconductor wafer structure 17 subsequent to FIG. 10 in which first and second metal gate electrodes are formed with one or more high-k gate dielectric layers to provide a high performance CMOS device. Of course, it will be appreciated that such advanced gate features are not required, and the planarized dual surface orientation wafer could also be integrated with other dielectric materials (such as silicon dioxide) and gate structures (such as polysilicon gates). In the implementation depicted in FIG. 11, PMOS and NMOS devices may be formed on the exposed semiconductor layers (i.e., second semiconductor layer 90 and epi semiconductor layer 70), which may include well regions (not shown) in each layer 70, 90. Specifically, a first gate electrode 151 is an NMOS device formed on a portion of the second conductive layer 90 in the SOI region, and a second gate electrode 161 is a PMOS device formed on a portion of the second epi semiconductor layer 70. Alternatively, the first gate electrode 151 may be a PMOS device and the second gate electrode 161 may be an NMOS device. The allocation of device types to device regions preferably exploits the differing crystal orientation of the underlying layers 70, 90, to provide a high performance CMOS device where the PMOS device has improved hole mobility. This may be accomplished, for example, by forming the PMOS devices over the semiconductor material that has a (110) or (111) orientation, whereas the NMOS devices are formed over a semiconductor surface having a (100) orientation. In addition, the hole mobility of the PMOS devices may be further improved by forming the PMOS gate electrodes over a layer of compressed silicon germanium having a (110) orientation.

In the semiconductor wafer structure 17 depicted in FIG. 11, a dual gate integrated circuit device formed with a CMOS fabrication process is illustrated where at least one gate electrode is formed over one or more relatively high-k gate dielectric layers. As will be appreciated, a relatively high-k dielectric is a dielectric having a dielectric constant that is higher than (e.g., at least 1.5 times) the dielectric constant of $SiO_2$. The depicted wafer structure 17 includes a first SOI semiconductor layer 90—in which may be formed a first well region (not shown)—and a second epi-layer 70—in which may be formed a second well region (not shown)—that are laterally displaced with respect to one another. The first and second well regions contain impurities such that one of the wells is a p-doped well and one of the wells is an n-doped well. In the described embodiment, the first well in the SOI layer 90 is a p-doped well (p-well) in which NMOS transistors are formed, and the second well in the epi-layer 70 is an n-doped well (n-well) in which PMOS transistors are formed.

Following the formation of wells and isolation trenches, at least a first gate dielectric layer 110 is blanket deposited across the entire wafer structure 17. The first dielectric layer may be used to form at least part of the gate dielectric for all transistors on the wafer, or alternatively, the first dielectric layer may be used for only a first type of transistor formed on the wafer. In the depicted embodiment, the first dielectric layer 110 will serve as at least part of the gate dielectric for all transistors formed on the wafer structure 17. In an embodiment in which the first well in the SOI layer 90 is a (100)-oriented p-well region and the second well in the epi-layer 70 is a (110)-oriented n-well region, at least part of the first gate dielectric layer 110 is used as at least part of the gate dielectric in the NMOS and PMOS transistors. In one such implementation, first dielectric layer 110 is a metal-oxide compound formed by chemical vapor deposition or by atomic layer deposition having a typical final thickness is in the range of 0.1-10 nanometers. A suitable metal oxide compound for use as first dielectric layer 110 is hafnium oxide (preferably $HfO_2$), though other oxides, silicates or aluminates of zirconium, aluminum, lanthanum, strontium, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_X$, $ZrSiO_X$, $LaSiO_X$, $YSiO_X$, $ScSiO_X$, $CeSiO_X$, $HfLaSiO_X$, $HfAlO_X$, $ZrAlO_X$, and $LaAlO_X$. In addition, multi-metallic oxides (for example barium strontium titanate, BST) may also provide high-k dielectric properties.

After forming the first dielectric layer 110, one or more first gate electrodes 151, 171 are formed above first SOI semiconductor layer 90 using a metal gate electrode formation sequence. For example, the gate electrode 151 may be formed from a single conductive layer or by sequentially depositing or forming a first gate layer 112, a second conductive layer 114, and a third gate layer 116 over the first dielectric layer 110 to form a first gate stack. In one embodiment, the first gate layer 112 is a TaSiN layer having a thickness in the range of 1-20 nanometers, though other gate layer materials may be used, such as polysilicon, SiGe, other silicon-based materials or a metal-based layer. In another embodiment, the first gate layer 112 is a TaC or $TaC_XN_Y$ layer having a thickness in the range of 1-100 nanometers. The conductive layer 114 is an optional layer that may be used, for example, to simplify integration issues. Conductive layer 114 may be a heavily doped polysilicon, tungsten, or another suitable electrically conductive material having a thickness in the range of approximately 10-100 nanometers. Layer 116 may be another metal or may be a conducting or non-conducting layer. Once the first gate stack is formed, conventional gate electrode etch processing steps may be used to form the desired gate electrode 151 and/or to clear or partially etch the remaining exposed portions of the first gate dielectric layer 110.

Following formation of the first gate electrodes 151, 171, a second gate dielectric layer 120 may optionally be formed over wafer structure 17, such as by using conventional chemical vapor deposition, oxide growth or atomic layer deposition techniques. The second gate dielectric layer 120 may be a different material than first gate dielectric 110 and the thickness of the second gate dielectric layer 120 over the second epi layer 70 may be different than the thickness of first gate dielectric 110 over first SOI semiconductor layer 90. Either or both of the first gate dielectric layer 110 and the second gate dielectric layer 120 are high-k dielectrics. As will be appreciated, a high-k dielectric is a dielectric having a dielectric constant that is at least 1.5 times the dielectric constant of $SiO_2$. In an embodiment suitable for its use in conjunction with PMOS transistors (such as those formed with TiN, MoON, MoN, $IrO_x$, $ReO_x$, $RuO_x$, Ti, Ta, $W_2N$, etc.) having a gate electrode, the second gate dielectric 120 serves as a gate dielectric cap layer for the PMOS transistor devices, and may be implemented as an atomic layer deposited (ALD) dielectric film (e.g., $Al_2O_3$) having a thickness in the range of 0.5-10 nanometers. Although the second gate dielectric layer 120 is depicted in FIG. 11 as being formed on the remaining, unetched portion of the first gate dielectric 110 over the second epi layer 70, it will be appreciated that the second gate dielectric layer 120 may also be formed on the surface of the second epi layer 70 when the first gate dielectric layer 110 has been cleared entirely from the exposed portions of the wafer surface.

After formation of the first gate electrodes 151, 171 and second gate dielectric layer 120, a second gate electrode 161 is formed above second epi layer 70 using a metal gate electrode formation sequence. For example, the gate electrode 161 may be formed from a single conductive layer or by sequentially depositing or forming a first gate layer 132, a second conductive layer 134, and a third gate layer 136 over the second dielectric layer 120 to form a second gate stack which is etched to form the second gate electrode 161. In one embodiment, the first gate layer 132 is a TiN layer having a thickness in the range of 1-100 nanometers. When the second gate electrode 161 is formed separately from the first gate electrode using a single conductive layer or a sequence of layers 132, 134, 136 formed over the second epi layer 70, the composition and thickness of the second gate electrode 161 may be equivalent to or different from the composition and thickness of the first gate electrode 151. Whatever the composition and thickness of the first and second gate electrodes, the gate dielectric layers under the first and second gate electrodes may advantageously be formed to have an equivalent electrical thickness.

Figure 12:
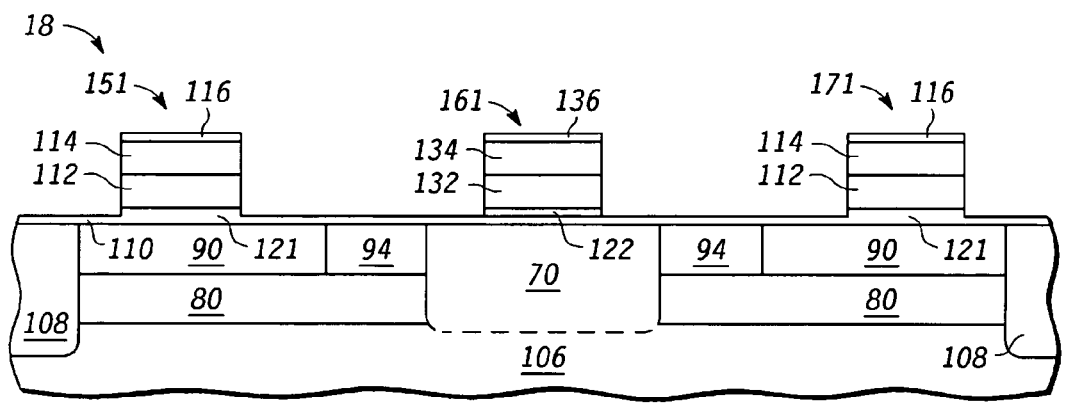
FIG. 12 illustrates processing subsequent to FIG. 11 after selective removal of a gate dielectric from the gate electrodes.

Referring to FIG. 12, a selective and controlled etch process may be used to remove at least a thin layer from any exposed portion of the second gate dielectric layer 120. At the conclusion of the etching process, a remnant portion 122 of the second gate dielectric layer 120 under the second gate electrode 161 remains to form all or part of the gate dielectric for the second gate electrode 161, while the remnant portion 121 of the first gate dielectric for the first gate electrode 151 is formed entirely from the first gate dielectric layer 110.

It will be appreciated that additional processing steps will be used to complete the fabrication of first and second gate electrodes into transistors. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

In one form there is provided herein a method for fabricating a dual surface orientation semiconductor structure by forming a first semiconductor layer having a first crystal orientation, and then forming over the first semiconductor layer a second semiconductor layer (e.g., (100) p-type silicon) that is electrically isolated from the first semiconductor layer (e.g., by a buried oxide layer) and that has a second, different crystal orientation. After a nitride mask layer is formed over the second semiconductor layer, the mask is used to form a trench that exposes the first semiconductor layer without exposing the second semiconductor layer. All or part of the trench is filled with a selectively deposited first epitaxial semiconductor layer that is electrically isolated from the second semiconductor layer (e.g., by a shallow trench isolation region) and that has a third crystal orientation that is the same as the first crystal orientation. The first epitaxial semiconductor layer (e.g., (110) n-type silicon) is formed by epitaxially growing silicon on an exposed surface of the first semiconductor layer to selectively form crystalline silicon on the first semiconductor layer, but not on the nitride mask. Next, silicon is blanket deposited to cover the wafer structure by forming a polysilicon layer over the mask and forming a crystalline silicon layer over the first epitaxial semiconductor layer so that the polysilicon layer and crystalline silicon layer are substantially coplanar. A chemical mechanical polish step is then performed to remove the polysilicon layer, the crystalline silicon layer, the mask and at least part of the second semiconductor layer and the first epitaxial semiconductor layer so that the second semiconductor layer is substantially coplanar with the first epitaxial semiconductor layer. In addition or in the alternative, a chemical mechanical polish step and a chemical etch are performed to completely remove the polysilicon layer to obtain a substantially planar polish surface. After the polishing and/or etching the first epitaxial semiconductor layer so that it is substantially coplanar with the second semiconductor layer, a first gate electrode structure (including a first gate dielectric layer and a first conductive layer) may be formed over the first epitaxial semiconductor silicon layer, while a second gate electrode structure (including a second gate dielectric layer and a second conductive layer) may be formed over the second semiconductor layer.

In another form, a method is disclosed for forming a semiconductor structure on a wafer whereby a first semiconductor layer having a first crystal orientation is formed, and then a second semiconductor layer (having a second, different crystal orientation) and an adjacent isolation region are formed over the first semiconductor layer and electrically isolated therefrom (e.g., by a buried insulator layer). A trench opening is then formed that exposes the first semiconductor layer without exposing the second semiconductor layer. In a selected implementation, the trench opening is formed by patterning and etching a mask layer on the second semiconductor layer and a portion of the isolation region to form an opening through the isolation region and to the first semiconductor layer. Subsequently, the trench is at least partially filled by epitaxially growing a first epitaxial semiconductor layer on an exposed surface of the first semiconductor layer that is higher than the isolation region. Silicon is subsequently non-selectively deposited to cover the wafer with a near uniform thickness of polysilicon and crystalline silicon, where the polysilicon is formed on a mask layer or isolation region, and the crystalline silicon thickens the first epitaxial semiconductor layer and any exposed second semiconductor layer. By performing a chemical mechanical polish to remove the polysilicon and at least part of the second semiconductor layer and first epitaxial semiconductor layer, the second semiconductor layer is substantially coplanar with the first epitaxial semiconductor layer.

In yet another form, there is provided a method for fabricating a semiconductor structure having substantially uniform dual-surface orientation substrate heights by forming first and second semiconductor substrates that are electrically isolated from each other by at least an isolation region, where the first semiconductor substrate has a first crystallographic orientation and where the second semiconductor substrate has a second crystallographic orientation that is different from the first crystallographic orientation. In a selected implementation, the first and second semiconductor substrates may be formed by first forming the second semiconductor substrate (e.g., (110) or (100) p-type silicon) over an electrically isolated first semiconductor layer, selectively etching a trench opening to exposed a portion of an underlying first semiconductor layer, and then epitaxially growing a first epitaxial semiconductor material on at least an exposed surface of the first semiconductor layer to form a first semiconductor substrate (e.g., (100) or (110) n-type silicon). As disclosed, the isolation region may be formed either before or after the formation of the first semiconductor substrate. Under the method, a semiconductor material is blanket deposited over the first and second semiconductor substrates. This results in a polysilicon layer being formed over the first isolation region or on an underlying mask layer. In addition, this results in a crystalline silicon layer being formed on at least the first semiconductor substrate and any exposed portion of the second semiconductor substrate. The first semiconductor substrate and the polysilicon layer may be polished so that the first semiconductor substrate is substantially coplanar with the second semiconductor substrate.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, an alternative to the device structure shown in FIG. 11 is for first well (not shown) in the layer 90 to be an n-doped well and the second well (not shown) in the layer 70 to be p-doped. Also the first gate layers (112, 132) and the second conductive layers (114, 134) may be different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. For example, the disclosed semiconductor manufacturing processes improve the post-CMP substrate surface planarity in a Dual-Surface Orientation (DSO) integration to reduce or eliminate the process and performance limitations associated with non-uniform substrate heights. In selected embodiments, photo control is improved by planarizing the dual surface orientations. In other embodiments, by improving surface uniformity/planarity of the structures across a wafer with structures of varying sizes and density, dispersion in device parametrics and performance is reduced or eliminated. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a dual surface orientation semiconductor structure, comprising:
    forming a first semiconductor layer having a first crystal orientation;
    forming a second semiconductor layer over at least part of the first semiconductor layer, wherein the second semiconductor layer is electrically isolated from the first semiconductor layer and has a second crystal orientation that is different from the first crystal orientation;
    forming a mask over the second semiconductor layer;
    using the mask to form a trench opening that exposes the first semiconductor layer without exposing the second semiconductor layer;
    filling at least part of a trench opening by epitaxially growing a first epitaxial semiconductor material on at least an exposed surface of the first semiconductor layer to form a first epitaxial semiconductor layer that is electrically isolated from the second semiconductor layer; and
    blanket depositing silicon to form a polysilicon layer on the mask and to form a crystalline silicon layer to thicken the first epitaxial semiconductor layer so that the polysilicon layer and crystalline silicon layer are substantially coplanar.

2. The method of claim 1, further comprising performing a chemical mechanical polish step to remove the polysilicon layer and at least part of the crystalline silicon layer so that the first epitaxial semiconductor layer is substantially coplanar across feature sizes.

3. The method of claim 1, wherein the mask is formed from a nitride layer.

4. The method of claim 1, wherein the second semiconductor layer comprises (100) p-type silicon and the first epitaxial semiconductor layer comprises (110) n-type silicon.

5. The method of claim 1, wherein the second semiconductor layer comprises (100) p-type silicon and the first epitaxial semiconductor layer comprises (110) n-type silicon that is epitaxially grown from an exposed surface of the first semiconductor layer.

6. The method of claim 1, where epitaxially growing silicon on an exposed surface of the first semiconductor layer comprises a selective silicon deposition step that completely fills the trench.

7. The method of claim 1, further comprising forming the second semiconductor layer over a buried oxide layer to form a semiconductor-on-insulator substrate.

8. The method of claim 1, where the second semiconductor layer is electrically isolated from the first epitaxial semiconductor layer by a shallow trench isolation region.

9. The method of claim 1, further comprising:
    forming a first gate electrode structure over the first epitaxial semiconductor layer, said first gate electrode structure comprising at least a first relatively high-k dielectric gate layer and a first conductive layer; and
    forming a second gate electrode structure over the second semiconductor layer, said second gate electrode structure comprising at least a second relatively high-k dielectric gate layer and a second conductive layer.

10. The method of claim 1, further comprising performing a chemical mechanical polish step and a chemical etch to completely remove the polysilicon layer so that the second semiconductor layer and the first epitaxial semiconductor layer are substantially coplanar.

11. A method for forming a semiconductor structure on a wafer, comprising:
    forming a first semiconductor layer having a first crystal orientation;
    forming a second semiconductor layer and an adjacent isolation region over at least part of the first semiconductor layer, wherein the second semiconductor layer is electrically isolated from the first semiconductor layer and has a second crystal orientation that is different from the first crystal orientation;
    filling at least part of a trench opening that exposes the first semiconductor layer without exposing the second semiconductor layer by epitaxially growing a first epitaxial semiconductor layer on at least an exposed surface of the first semiconductor layer;

non-selectively depositing silicon to cover the wafer with a near uniform thickness of silicon comprising polysilicon and crystalline silicon, where the crystalline silicon thickens the first epitaxial semiconductor layer and the second semiconductor layer; and performing a chemical mechanical polish step to remove the polysilicon and at least part of the second semiconductor layer and first epitaxial semiconductor layer so that the second semiconductor layer is substantially coplanar with the first epitaxial semiconductor layer.

12. The method of claim 11, where filling at least part of a trench opening comprises:

forming a mask layer over at least the second semiconductor layer and a portion of the isolation region;

patterning and etching the mask layer to form an opening through the isolation region and to the first semiconductor layer; and epitaxially growing the first epitaxial semiconductor layer on at least an exposed surface of the first semiconductor layer to form a first epitaxial semiconductor layer that is higher than the isolation region.

13. The method of claim 11, where non-selectively depositing silicon comprises forming polysilicon on the isolation region.

14. The method of claim 11, further comprising:

forming a first gate electrode structure over the first epitaxial semiconductor layer, said first gate electrode structure comprising at least a first gate dielectric layer and a first conductive layer; and forming a second gate electrode structure over the second semiconductor layer, said second gate electrode structure comprising at least a second gate dielectric layer and a second conductive layer.

15. The method of claim 12, where non-selectively depositing silicon comprises forming polysilicon on the mask layer.

16. A method for fabricating a semiconductor structure having substantially uniform dual-surface orientation substrate heights, comprising:

forming first and second semiconductor substrates that are electrically isolated from each other by at least a first isolation region, where the first semiconductor substrate has a first crystallographic orientation and where the second semiconductor substrate has a second crystallographic orientation that is different from the first crystallographic orientation;

blanket depositing silicon to form a polysilicon layer over the first isolation region and to form a crystalline silicon layer on at least the first semiconductor substrate; and polishing the first semiconductor substrate and the polysilicon layer so that the first semiconductor substrate is substantially coplanar with the second semiconductor substrate.

17. The method of claim 16, where forming first and second semiconductor substrates comprises:

forming a first semiconductor layer having a first crystal orientation;

forming a second semiconductor substrate over at least part of the first semiconductor layer, where the second semiconductor substrate has a second crystal orientation that is different from the first crystal orientation and where the second semiconductor substrate is electrically isolated from the first semiconductor layer by a buried insulator layer;

forming a trench opening to expose at least a portion of the first semiconductor layer; and epitaxially growing a first epitaxial semiconductor material on at least an exposed surface of the first semiconductor layer to form a first semiconductor substrate having the first crystal orientation.

18. The method of claim 16, where the second semiconductor substrate comprises (110) or (100) p-type silicon, the first semiconductor substrate comprises (100) or (110) n-type silicon.

19. The method of claim 16, where the first isolation region is formed prior forming the first semiconductor substrate.

20. The method of claim 16, where the first isolation region is formed after forming the first semiconductor substrate.

* * * * *

UNITED STATES PATENT AND TRADEMARK OFFICE
CERTIFICATE OF CORRECTION

PATENT NO.       : 7,754,587 B2                                              Page 1 of 1
APPLICATION NO.  : 11/375796
DATED            : July 13, 2010
INVENTOR(S)      : Gregory S. Spencer, Peter J. Beckage and Mariam G. Sadaka It is certified that error appears in the above-identified patent and that said Letters Patent is hereby corrected as shown below:

Col. 14, line 37, claim 19 should read "is formed prior to forming the first semiconductor substrate."

Signed and Sealed this

Twenty-eighth Day of September, 2010

David J. Kappos
*Director of the United States Patent and Trademark Office*